United States Patent
Liu et al.

(10) Patent No.: US 9,142,311 B2
(45) Date of Patent: Sep. 22, 2015

(54) SCREENING FOR REFERENCE CELLS IN A MEMORY

(71) Applicant: Spansion LLC, Sunnyvale, CA (US)

(72) Inventors: Zhizheng Liu, San Jose, CA (US); Cindy Sun, San Jose, CA (US); He Yi, Fremont, CA (US); Gulzar Kathawala, Campbell, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 168 days.

(21) Appl. No.: 13/917,141

(22) Filed: Jun. 13, 2013

(65) Prior Publication Data

US 2014/0369141 A1     Dec. 18, 2014

(51) Int. Cl.
G11C 16/28     (2006.01)
G11C 7/02      (2006.01)

(52) U.S. Cl.
CPC ........ G11C 16/28 (2013.01); G11C 7/02 (2013.01); G11C 2211/5634 (2013.01)

(58) Field of Classification Search
CPC ... G11C 7/02; G11C 16/28; G11C 2211/5634
See application file for complete search history.

(56) References Cited

U.S. PATENT DOCUMENTS

| | | | |
|---|---|---|---|
| 7,345,916 B2 * | 3/2008 | Yang et al. | 365/185.14 |
| 8,630,140 B2 * | 1/2014 | Lee | 365/210.1 |
| 2006/0233028 A1 * | 10/2006 | Suitou et al. | 365/189.09 |
| 2008/0094923 A1 | 4/2008 | Kwon | |
| 2009/0027952 A1 | 1/2009 | Kang et al. | |
| 2009/0201710 A1 | 8/2009 | Ueda | |
| 2012/0026799 A1 | 2/2012 | Lee | |
| 2013/0010528 A1 | 1/2013 | Ramani et al. | |

OTHER PUBLICATIONS

International Search Report and Written Opinion of the International Searching Authority for International Application No. PCT/US2014/040677, mailed Oct. 7, 2014, 11 pages.

* cited by examiner

*Primary Examiner* — Vanthu Nguyen

(57) ABSTRACT

Selecting an array from among a plurality of arrays in a memory as a reference array. An exemplary method includes evaluating memory cells within the reference array to select a first reference cell associated with a first operation of the memory, and repeating the evaluating and the selecting to select a second reference cell from within the reference array, the second reference cell being associated with a second operation of the memory.

15 Claims, 4 Drawing Sheets

SCREENING FOR REFERENCE CELLS IN A MEMORY

BACKGROUND

Advances in semiconductor manufacturing processes, digital system architecture, and wireless infrastructure, among other things, have resulted in a vast array of electronic products, particularly consumer products, that drive demand for ever-increasing performance and density in non-volatile memory. One way of increasing the performance and density of non-volatile memories such as, but not limited to, a flash memory, is to shrink the dimensions of transistors that are used in the form of memory cells in flash memories. It is well-recognized that shrinking the physical dimensions of transistors also reduces the size of the storage media itself and thus reduces the amount of charge that can be stored. One drawback of this approach, however, is such systems are more prone to manufacturing defects and larger cell to cell variations. These manufacturing defects and variations affect memory cells and reference memory cells, thereby reducing operation and reliability of the non-volatile memories.

Conventionally, the way in which a reference cell is selected for a given memory is hardware fixed, for example, by the manufacturer. Therefore, once fixed, the selection of a reference cell cannot be changed. Generally, reference cells are selected for a non-volatile memory based on the technology associated with the non-volatile memory. As such, when the conventionally fixed references are affected by manufacturing defects or cell to cell variation, etc., the entire nonvolatile memory fails because certain operations such as, for example, the read operation with respect to any memory cell in the non-volatile memory may not be carried out successfully.

One possible effect on the reference cell due to manufacturing defects is that the reference cell has high random telegraph noise (RTN). In this case, the reference threshold voltage and/or an active reference current level associated with the reference cell are rendered unstable, This leads to unreliable comparison of these levels with corresponding levels associated with a given memory cell of the memory. As a result, certain operations such as, for example, the read operation with respect to the given memory cell in the non-volatile memory may not be carried out successfully.

Another possible effect on the reference cell due to manufacturing defects or cell to cell variation is that the reference cell becomes less robust and less reliable. For example, assume the reference threshold voltage and/or the active reference current level associated with the reference cell may be programmable. In this case, the reference threshold voltage and/or the active reference current level associated with the reference cell may have to be calibrated to a desired level of, for example, 5V. Finally, the reference threshold voltage and/or the active reference current level should be stable so that certain operations such as, for example, the read operation may be carried out successfully. In this case, when the reference cell has been affected by manufacturing defects or cell to cell variation, an increasing number of over-programming and/or over-erasing operations are required to be performed on the reference cell to stabilize the reference threshold voltage at the desired level of 5V. The over-programming operation may be an operation that increases a measured reference threshold voltage when the measured reference threshold voltage is found to be less than the desired level of 5V, and the over-erasing operation may be an operation that reduces the measured reference threshold voltage when the measured reference threshold voltage is found to be greater than the desired level of 5V. However, performing this increased number of over-programming and/or over-erasing operations to stabilize the reference threshold voltage at the desired level of 5V reduces the integrity and stability of the reference cell, thereby making the reference cell less robust and less reliable.

SUMMARY

System, method, and computer program product embodiments for screening reference memory cells in a memory are described herein.

In an embodiment, a system includes a memory and a processor to enable selection of an array from among a plurality of arrays in the memory as a reference array, evaluation of memory cells within the reference array to select a first reference cell associated with a first operation of the memory, and repetition of the evaluating to select a second reference cell from within the reference array. The second reference cell is associated with a second operation of the memory, and so on for multiple references.

In another embodiment, a method for screening reference cells in a memory is described. The method operates by selecting an array from among a plurality of arrays in a memory as a reference array, evaluating memory cells within the reference array to select a first reference cell associated with a first operation of the memory, and repeating the evaluating to select a second reference cell from within the reference array. The second reference cell is associated with a second operation of the memory, and so on for multiple references.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate embodiments of the invention and, together with the description, further serve to explain the principles of the invention and to enable a person skilled in the relevant art(s) to make and use the invention.

DETAILED DESCRIPTION

To address the above issues and others, an embodiment screens memory cells of a memory to select a reference cell, instead of the conventional fixing of the reference cell as discussed above. In an embodiment, the screening of memory cells is conducted after the manufacturing of the memory. The proposed screening may isolate the memory from the above-mentioned issues, and increases the reliability of the reference cells, thereby improving operation of the memory.

Figure 1:
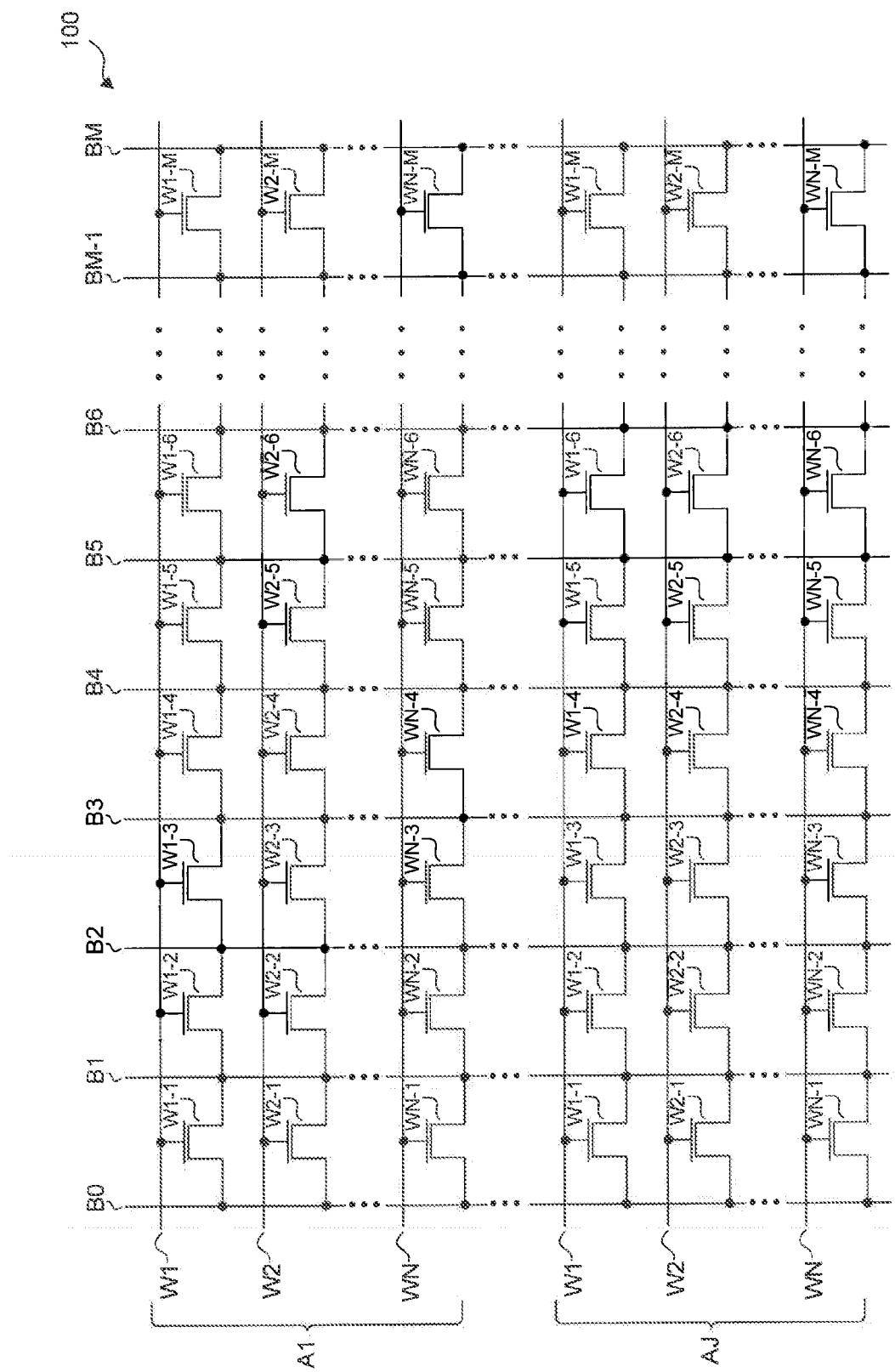
FIG. 1 illustrates an exemplary memory array comprising memory cells according to an embodiment.

FIG. 1 illustrates an exemplary memory 100 comprising memory cells, e.g., in the form of memory cells (e.g., non-volatile memory cells), according to an embodiment. The memory 100 includes a plurality of memory arrays A1 ... AJ, where J is an integer number. Each memory array includes Wordlines W1 ... WN, which may be connected to respective gates of M number of memory cells, where M is an integer number. For example, the Wordline W1 is connected to the respective gates of memory cells W1-1, W1-2 ... W1-M, Wordline W2 is connected to the respective gates of memory cells W2-1, W2-2 ... W2-M, and so on. Further, the memory 100 includes a plurality of Bitlines B0 ... BM, which are connected to respective sources and drains of N number of the memory cells. For example, Bitline B0 is connected to respective drains of memory cells W1-1, W2-1 ... WN-1, and is connected to respective sources of memory cells W1-2, W2-2 ... WN-2, Bitline B1 is connected to respective drains of memory cells W1-2, W2-2 ... WN-2, and is connected to respective sources of non-volatile memory cells W1-3, W2-3 ... WN-3, and so on. In this way, each of the plurality of memory arrays A1 ... AJ includes M×N number of memory cells. In an exemplary embodiment, a given memory array may have a different number of M memory cells and a different number of N Wordlines with respect to another memory array. In an embodiment, the non-volatile memory cells may include floating gate transistors.

The non-volatile memories include a reference memory cell (hereinafter, reference cell) among the memory cells. Certain operations such as, for example, a read operation related to a memory cell are performed by comparing a threshold voltage level and/or an active conducting current level associated with the memory cell against a corresponding known reference threshold voltage and/or an active reference current level associated with the reference cell under a technology determined electric field. For example, when data stored in a given memory cell is to be read, a threshold voltage (potential) level and/or an active reference current level associated with the given memory cell is compared with a corresponding known reference threshold voltage and/or an active reference current level associated with the reference cell. In an embodiment, when the threshold voltage level and/or the active reference current level associated with the given memory cell is greater than the corresponding known reference threshold voltage and/or the active reference current level associated with the reference cell, the system proceeds to read the data stored in the given memory cell.

The reference threshold voltage and/or current may be sourced from a smaller reference array structure which can be built from memory cells or fixed voltage and/or current sources. Each read operation can be defined with different electric fields across the memory cell and can have its own reference source for fine tuning purposes.

Figure 2:
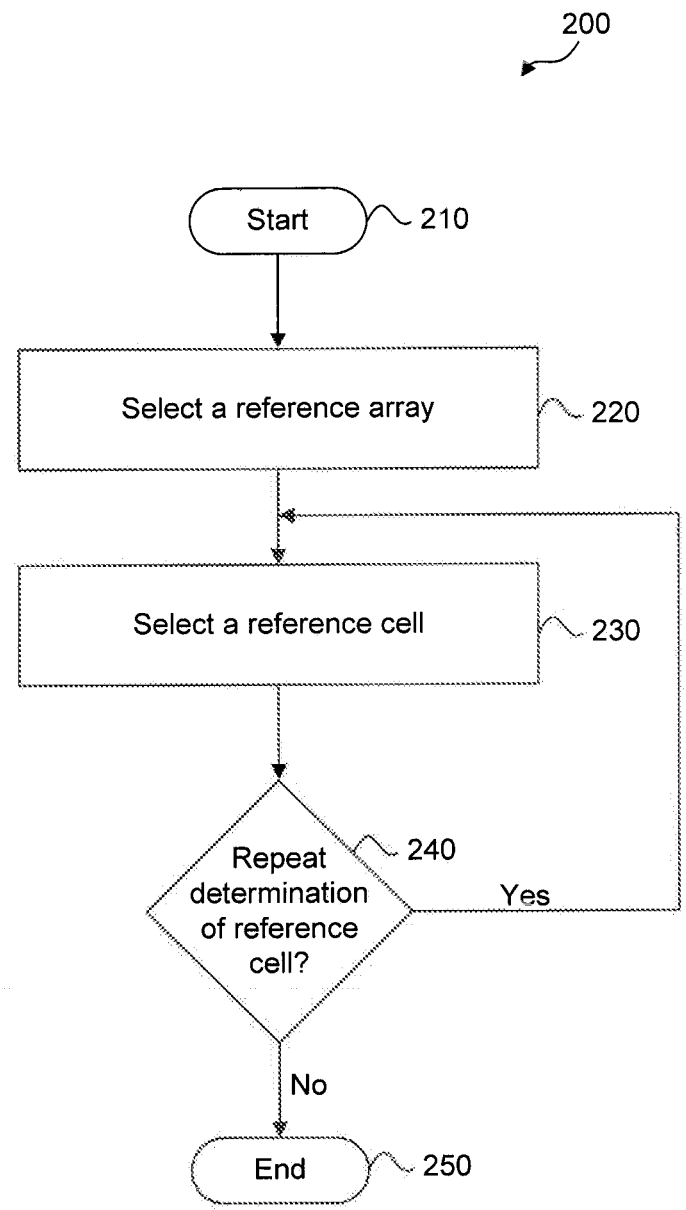
FIG. 2 illustrates an exemplary flowchart illustrating a process for selecting a reference cell according to an embodiment.

FIG. 2 illustrates an exemplary method 200 for selecting a reference cell according to an embodiment. The method starts at step 210. At step 220, a reference array is selected from the plurality of memory arrays A1 ... AJ. The reference array is an array from which the reference cell is selected. In an embodiment, the reference array may be selected based on a convenient location of the reference array among the plurality of memory arrays A1 ... AJ in the memory and/or based on technological design preferences related to the memory. In another embodiment, the reference array may be selected randomly.

At step 230, the memory cells included in the selected reference array are evaluated and/or screened to determine or select a reference cell. Step 230 is discussed in greater detail below with respect to FIG. 3.

At step 240 (which is optional), it is decided whether the selection or determination of a reference cell in step 230 is to be repeated. For example, in an embodiment, a plurality of reference cells may be selected from among the memory cells included in the reference array, where each of the plurality of reference cells is associated with a corresponding application and/or operation of the memory. In this embodiment, the reference cell determined at step 230 may be associated with, for example, a read operation of the memory, and the determination of reference cells may be repeated for a write operation, an erase operation, an error correction operation, etc. In another embodiment, even for a given application, the determination of a reference cell may be repeated to determine whether a plurality of memory cells meet the criteria of being selected as reference cells. When a plurality of memory cells meet the criteria of being selected as reference cells, the memory cell having the least deviation from the criteria is selected as the reference cell for the given application. The method ends at step 250.

In an embodiment, a reference cell selected in step 230 is excluded from the evaluation and/or the screening process when step 230 is repeated by operation of step 240. In another embodiment, previously selected reference cells are not so excluded. Further, in another embodiment, parameters associated with determining or selecting the reference cell in step 230 may be different from parameters associated with subsequently determining or selecting a number reference cell by operation of step 240.

Figure 3:
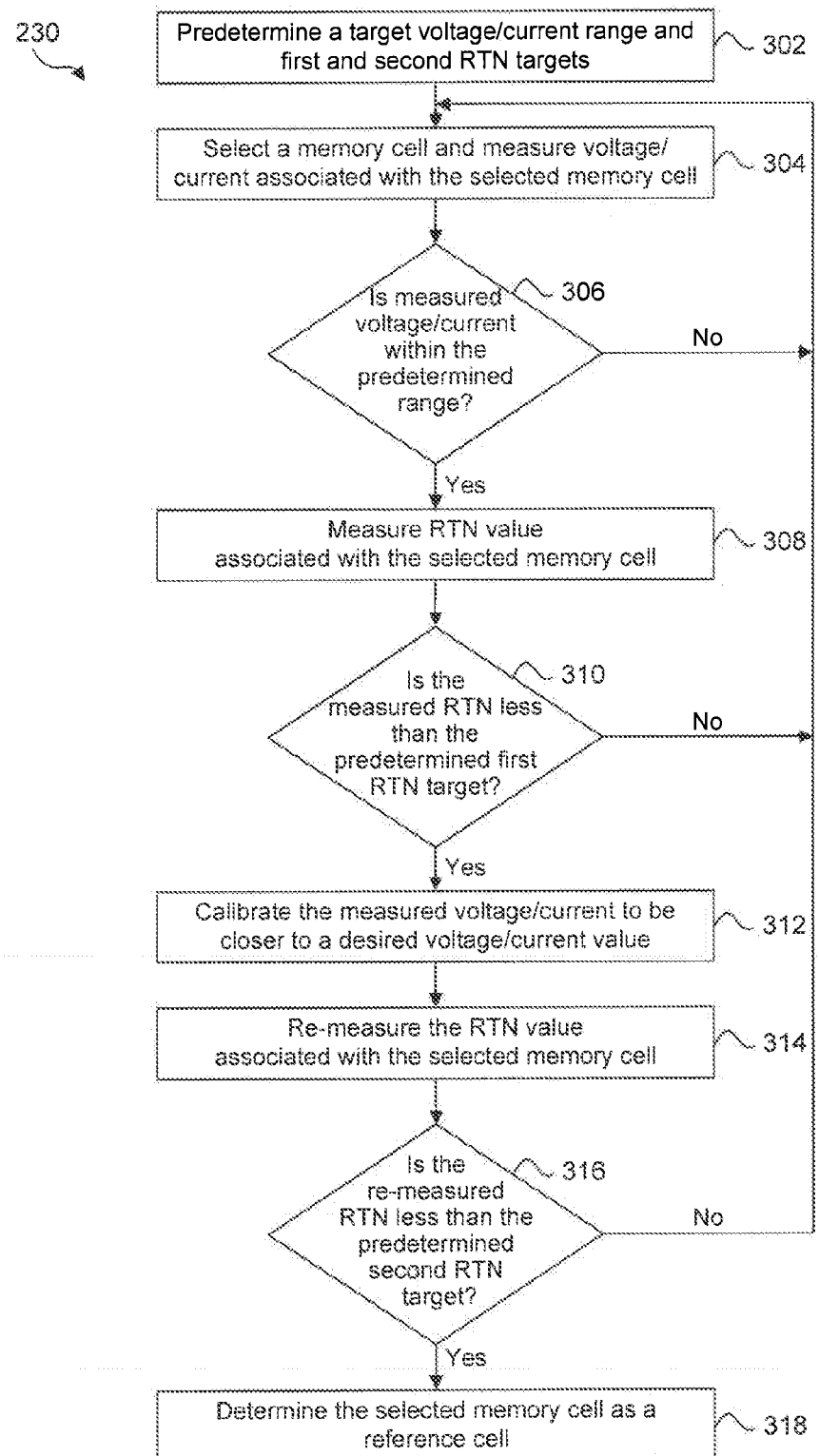
FIG. 3 illustrates the exemplary flowchart illustrating a process for selecting a reference cell in further detail according to an embodiment.

FIG. 3 illustrates exemplary operation of step 230 according to an embodiment in greater detail. At step 302, a target threshold voltage range and/or a target active current range is determined for a memory cell included in memory 100. The target threshold voltage range and/or the target active current range may be based on operating parameters of the memory. For example, when the memory is configured to have an operating threshold voltage range of −1V to 8V, a first target threshold voltage and a second target threshold voltage may be chosen from the operating threshold voltage range of −1 V to 8V, where a difference between the first target threshold voltage and the second target threshold voltage may be the target threshold voltage range. The second target threshold voltage may be greater than the first target threshold voltage. Some non-limiting examples of the target threshold voltage range include −1V to 1V, 0V to 2V, 4V to 8V, −1V to 8V, etc.

Further at step 302, first and second target RTN values may also be predetermined. In an embodiment, the RTN value of the memory cell may be a current (or a voltage) associated with, for example, an operation such as reading data from the memory cell. The first and second target RTN values may be a maximum value of RTN that may be acceptable for a reference cell. In an embodiment, the first RTN value may be different from the second RTN value. Some non-limiting examples of the RTN values include 1 μA, 0.5 μA, etc.

At step 304, a memory cell is selected from the selected reference array (in step 220), and a threshold voltage and/or an active current is measured for the selected memory cell. The measured threshold voltage may be the threshold voltage of a transistor that is used to implement the memory cell under consideration. The measured active current may be a current measured when an operation (e.g., reading, writing, etc.) is conducted on the memory cell under consideration.

At step 306, it is determined whether the measured threshold voltage and/or the measured active current are within the target threshold voltage range and/or the predetermined target current range determined in step 302, respectively. When the result of the determination at step 306 is a "Yes," the method moves to step 308. Otherwise, the method moves to step 304, and another memory cell from among the memory cells included in the reference array is selected for evaluation. The memory cell under consideration may be excluded from being considered as a reference cell in the future. In another embodiment, the memory cell under consideration may be again evaluated, and also selected as a reference cell in the future.

At step 308, the RTN associated with the memory cell under consideration is measured. In one embodiment, multiple measurements of the RTN value associated with the memory cell may be made, and a delta RTN value (ΔRTN) may be calculated. For example, the delta RTN value ΔRTN may be defined by taking a difference between two consecutively measured RTN values from among the multiple measurements. Alternatively, for example, the delta RTN value ΔRTN may be defined by taking a difference between a maximum measured RTN value and a minimum measured RTN value from among the multiple measurements.

At step 310, the delta RTN value ΔRTN is compared to the predetermined first target RTN value, and it is determined whether the delta RTN value ΔRTN is less than the predetermined first target RTN value. If it is determined that the delta RTN value ΔRTN is less than the predetermined first target RTN value, then the process moves to step 312. Otherwise, the method moves to step 304 and another memory cell from among the memory cells included in the reference array is selected for evaluation.

In an embodiment, steps 308 and 310 are performed to ensure that the calibration process discussed in step 312 is performed on a memory cell having acceptable RTN value. However, it is within the scope of the present disclosure to omit steps 308 and 310.

At step 312, the threshold voltage and/or an active current associated with the memory cell under consideration is calibrated to be closer to a desired threshold voltage and/or a desired active current, respectively. The desired threshold voltage and/or the desired active current may be within the predetermined target threshold voltage range and/or the predetermined target current range, respectively.

At step 314, the RTN associated with the memory cell under consideration is re-measured in a similar way as discussed above with respect to step 308. In an embodiment, multiple measurements of the RTN value associated with the memory cell may be made, and a re-measured delta RTN value may be calculated. For example, the re-measured delta RTN value may be defined by taking a difference between two consecutively re-measured RTN values from among the multiple re-measurements. Alternatively, for example, the re-measured delta RTN value may be defined by taking a difference between a maximum re-measured RTN value and a minimum re-measured RTN value from among the multiple re-measurements.

At step 316, the re-measured delta RTN value is compared to the predetermined second target RTN value, and it is determined whether the re-measured delta RTN value is less than the predetermined second target RTN value. If it is determined that the re-measured delta RTN value is less than the predetermined second target RTN value, then the process moves to step 318. Otherwise, the method moves to step 302 and another memory cell from among the memory cells included in the reference array is selected for evaluation.

In an embodiment, steps 314 and 316 are performed to verify that the calibration process conducted on the memory cell under consideration (in step 312) has not affected the RTN value associated with the memory cell under consideration. In an embodiment, the predetermined second target RTN value is less than the predetermined first target RTN value At step 318, the memory cell under consideration is selected as a reference cell.

Figure 4:
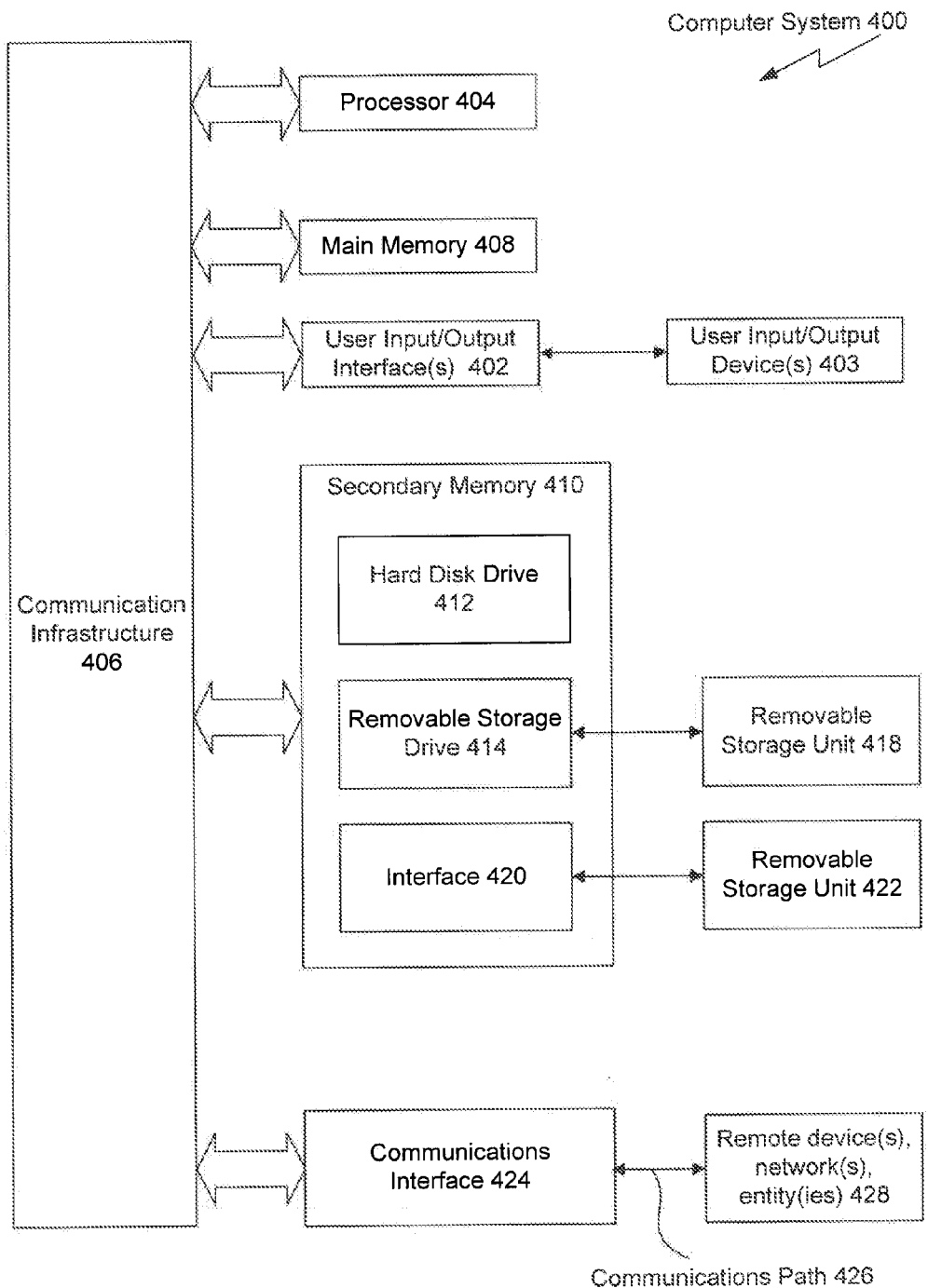
FIG. 4 illustrates an exemplary computer system useful for implementing various embodiments.

Various embodiments can be implemented, for example, using one or more well-known computer systems, such as computer system 400 shown in FIG. 4. Computer system 400 can be any well-known computer capable of performing the functions described herein, such as computers available from International Business Machines, Apple, Sun, HP, Dell, Sony, Toshiba, etc. One or more of the algorithms depicted in the methods illustrated in FIGS. 2 and 3 (e.g., selecting a reference array 220, selecting a reference array 230, repeating determination of the reference cell 240, etc.) and their corresponding steps can be executed on one or more distinct computer systems 400, or a portion thereof. Furthermore, any functions performed by any of the above features can be implemented on one or more distinct computer systems 400.

Computer system 400 includes one or more processors (also called central processing units, or CPUs), such as a processor 404. Processor 404 is connected to a communication infrastructure or bus 406.

One or more processors 404 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 400 also includes user input/output device(s) 403, such as monitors, keyboards, pointing devices, etc., which communicate with communication infrastructure 406 through user input/output interface(s) 402.

Computer system 400 also includes a main or primary memory 408, such as random access memory (RAM). Main memory 408 may include one or more levels of cache. Main memory 408 has stored therein control logic (i.e., computer software) and/or data.

Computer system 400 may also include one or more secondary storage devices or memory 410. Secondary memory 410 may include, for example, a hard disk drive 412 and/or a removable storage device or drive 414. Removable storage drive 414 may be a floppy disk drive, a magnetic tape drive, a compact disk drive, an optical storage device, tape backup device, and/or any other storage device/drive.

Removable storage drive 414 may interact with a removable storage unit 418. Removable storage unit 418 includes a computer usable or readable storage device having stored thereon computer software (control logic) and/or data. Removable storage unit 418 may be a floppy disk, magnetic tape, compact disk, DVD, optical storage disk, and/any other computer data storage device. Removable storage drive xx14 reads from and/or writes to removable storage unit 418 in a well-known manner.

According to an exemplary embodiment, secondary memory 410 may include other means, instrumentalities or other approaches for allowing computer programs and/or other instructions and/or data to be accessed by computer system 400. Such means, instrumentalities or other approaches may include, for example, a removable storage unit 422 and an interface 420. Examples of the removable storage unit 422 and the interface 420 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 400 may further include a communication or network interface 424. Communication interface 424 enables computer system 400 to communicate and interact with any combination of remote devices, remote networks, remote entities, etc. (individually and collectively referenced by reference number 428). For example, communication interface 424 may allow computer system 400 to communicate with remote devices 428 over communications path 426, which may be wired and/or wireless, and which may include any combination of LANs, WANs, the Internet, etc. Control logic and/or data may be transmitted to and from computer system 400 via communication path 426.

In an embodiment, a tangible apparatus or article of manufacture comprising a tangible computer useable or readable medium having control logic (software) stored thereon is also referred to herein as a computer program product or program storage device. This includes, but is not limited to, computer system 400, main memory 408, secondary memory 410, and removable storage units 418 and 422, as well as tangible articles of manufacture embodying any combination of the foregoing. Such control logic, when executed by one or more data processing devices (such as computer system 400), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 4. In particular, embodiments may operate with software, hardware, and/or operating system implementations other than those described herein Therefore, the present disclosure enables screening of memory cells in a memory for designation of stable and reliable memory cells as reference cells and assists in avoiding over-programming and/or over-erasing of levels associated with reference cells. The present disclosure also assists in screening out cells that have, for example, undesirable random telegraph noise (RTN). In this way, the proposed screening improves operation and reliability of the memory.

Conclusion

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A method, comprising:
   selecting an array from among a plurality of arrays in a memory as a reference array;
   evaluating memory cells within the reference array to select a first reference cell associated with a first operation of the memory, the evaluating comprising:
   selecting a memory cell as the first reference cell when a threshold voltage associated with the memory cell is within a target voltage range;
   obtaining a plurality of measured RTN values from the memory cells within the reference array;
   calculating a delta RTN value by taking a difference between two measured RTN values of the memory cells within the reference array; and
   determining whether the delta RTN value is less than a predetermined target RTN value of the first reference cell.

2. The method of claim 1, wherein the evaluating further comprises:
   determining the target voltage range based on an operating parameter of the memory cell;
   measuring the threshold voltage associated with the memory cell; and
   determining whether the measured threshold voltage is within the predetermined target voltage range.

3. A method, comprising:
   selecting an array from among a plurality of arrays in a memory as a reference array;
   evaluating memory cells within the reference array to select a first reference cell associated with a first operation of the memory, the evaluating comprising:
   selecting a memory cell as the first reference cell when a threshold voltage associated with the memory cell is within a target voltage range;
   obtaining a plurality of measurements of the RTN value from the memory cells within the reference array;
   calculating a delta RTN value by taking a difference between a maximum RTN value and a minimum RTN value; and
   determining whether the delta RTN value is less than a predetermined target RTN value; and determining whether to repeat the evaluating to select a second reference cell from within the reference array, the second reference cell being associated with a second operation of the memory.

4. The method of claim 2, wherein the evaluating further comprises:
calibrating the measured threshold voltage to be closer to a desired threshold voltage.

5. A system, comprising:
a memory; and
a processor configured to:
selectan array from among a plurality of arrays in the memory as a reference array;
evaluate memory cells within the reference array to select a first reference cell associated with a first operation of the memory, wherein, to evaluate the memory cells, the processor is further configured to:
select a memory cell as the first reference cell when a threshold voltage associated with the memory cell is within a target voltage range;
receive a plurality of RTN values from the memory cells within the reference array;
calculate a delta RTN value by taking a difference between two measured RTN values of the memory cells within the reference array;
determine whether the delta RTN value is less than a predetermined target RTN value.

6. The system of claim 5, wherein, to evaluate the memory cells, the processor is further configured to:
receive a measurement of the threshold voltage associated with the memory; and
determine whether the measured threshold voltage is within the predetermined target voltage range.

7. A system, comprising:
a memory; and
a processor configured to:
select an array from among a plurality of arrays in the memory as a reference array;
evaluate memory cells within the reference array to select a first reference cell associated with a first operation of the memory, wherein to evaluate the memory cells, the processor is further configured to:
select a memory cell as the first reference cell when a threshold voltage associated with the memory cell is within a target voltage range;
receive a plurality of RTN values from the memory cells within the reference array; and
calculate a delta RTN value by taking a difference between a maximum RTN value and a minimum RTN value, and
determine whether the delta RTN value is less than a predetermined target RTN value; and
determine whether to repeat the evaluation to select a second reference cell from within the reference array, the second reference cell being associated with a second operation of the memory.

8. The system of claim 6, wherein, to evaluate the memory cells, the processor is further configured to:
calibrate the measured threshold voltage to be closer to a desired threshold voltage.

9. A tangible computer-readable device having instructions stored thereon that, when executed by at least one computing device, cause the at least one computing device to perform operations comprising:
selecting an array from among a plurality of arrays in a memory as a reference array;
evaluating memory cells within the reference array to select a first reference cell associated with a first operation of the memory, the evaluating comprising:
selecting a memory cell as the first reference cell when a threshold voltage associated with the memory cell is within a target voltage range,
receiving a plurality of measured RTN values from the memory cells within the reference array,
calculating a delta RTN value by taking a difference between two measured RTN values of the memory cells within the reference array, and
determining whether the delta RTN value is less than a predetermined target RTN value of the first reference cell.

10. The tangible computer-readable device of claim 9, the operations further comprising:
predetermining the target voltage range based on an operating parameter of the memory cell;
measuring the threshold voltage associated with the memory; and
determining whether the measured threshold voltage is within the predetermined target voltage range.

11. A tangible computer-readable device having instructions stored thereon that, when executed by at least one computing device, cause the at least one computing device to perform operations comprising:
selecting an array from among a plurality of arrays in a memory as a reference array;
evaluating memory cells within the reference array to select a first reference cell associated with a first operation of the memory, the evaluating comprising:
selecting a memory cell as the first reference cell when a threshold voltage associated with the memory cell is within a target voltage range,
obtaining a plurality of measurements of the RTN value from the memory cells within the reference array,
calculating a delta RTN value by taking a difference between a maximum RTN value and a minimum RTN value, and
determining whether the delta RTN value is less than a predetermined target RTN value; and
determining whether to repeat the evaluating to select a second reference cell from within the reference array, the second reference cell being associated with a second operation of the memory.

12. The tangible computer-readable device of claim 10, wherein the evaluating comprises:
calibrating the measured threshold voltage to be closer to a desired threshold voltage.

13. The method of claim 1, further comprising:
determining whether repeat the evaluating to select a second reference cell from within the reference array, the second reference cell being associated with a second operation of the memory.

14. The system of claim 5, wherein, to evaluate the memory cells, the processor is configured to:
determine whether to repeat the evaluation to select a second reference cell from within the reference array, the second reference cell being associated with a second operation of the memory.

15. The tangible computer-readable device of claim 10, the operations further comprising:
determining whether to repeat the evaluating to select a second reference cell from within the reference array, the second reference cell being associated with a second operation of the memory.

* * * * *